(12) United States Patent
Nomura et al.

(10) Patent No.: US 7,755,278 B2
(45) Date of Patent: Jul. 13, 2010

(54) LIGHT EMITTING ELEMENT PROVIDED WITH ORGANIC CONDUCTIVE AND INORGANIC HOLE TRANSPORT LAYERS BETWEEN AN ELECTRODE AND ORGANIC EMISSIVE LAYER

(75) Inventors: Ryoji Nomura, Kanagawa (JP); Tsunenori Suzuki, Kanagawa (JP); Satoshi Seo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 920 days.

(21) Appl. No.: 11/202,891

(22) Filed: Aug. 12, 2005

(65) Prior Publication Data

US 2006/0046096 A1    Mar. 2, 2006

(30) Foreign Application Priority Data

Aug. 25, 2004   (JP) ............................. 2004-244803

(51) Int. Cl.
*H01L 51/50* (2006.01)
*H01L 51/52* (2006.01)

(52) U.S. Cl. ................... 313/504; 313/503; 313/506; 428/690

(58) Field of Classification Search ......... 313/500–506; 428/690
See application file for complete search history.

(56) References Cited

U.S. PATENT DOCUMENTS

| 6,373,186 B1 | 4/2002 | Arai et al. | |
| 6,597,109 B1 | 7/2003 | Arai et al. | 313/506 |
| 6,730,929 B2 * | 5/2004 | Fukuyama et al. | 313/504 |
| 6,927,537 B2 * | 8/2005 | Takahashi | 313/504 |
| 7,199,516 B2 | 4/2007 | Seo et al. | |
| 2003/0227253 A1 * | 12/2003 | Seo et al. | 313/504 |
| 2004/0191565 A1 * | 9/2004 | Takahashi | 428/690 |
| 2007/0200491 A1 | 8/2007 | Seo et al. | |

FOREIGN PATENT DOCUMENTS

| CN | 1261761 A | 8/2000 |
| CN | 1434669 A | 8/2003 |
| EP | 0 892 587 | 1/1999 |
| EP | 1 022 789 A2 | 7/2000 |
| EP | 1 331 667 A2 | 7/2003 |

(Continued)

OTHER PUBLICATIONS

Office Action re Chinese application No. CN 200510099446.5, dated May 9, 2008 (with English translation).

*Primary Examiner*—Mariceli Santiago
(74) *Attorney, Agent, or Firm*—Husch Blackwell Sanders LLP (57) ABSTRACT

A light emitting element with reduced inconvenience due to dust or the like and a manufacturing method thereof. One feature of the invention is a light emitting element having a first layer provided so as to be in contact with a first electrode, and a second layer provided so as to be in contact with the first layer, between the first electrode and a second electrode. A light emitting layer exists between the second layer and the second electrode. The first electrode, the second electrode, the first layer, the second layer, and the light emitting layer are stacked so that the first layer is formed in advance compared with the second layer. Here, the first layer is a layer containing an organic compound. Especially, an organic compound having conductivity is preferable among organic compounds. Alternatively, the second layer is a layer containing an inorganic compound. In particular, an inorganic compound having hole transport property is preferable among inorganic compounds.

30 Claims, 9 Drawing Sheets

FOREIGN PATENT DOCUMENTS

| | | |
|---|---|---|
| JP | 11-040365 | 2/1999 |
| JP | 11-121172 | 4/1999 |
| JP | 11-126689 | 5/1999 |
| JP | 11-224781 | 8/1999 |
| JP | 2002-075637 | 3/2002 |
| JP | 2003-217853 | 7/2003 |

* cited by examiner

LIGHT EMITTING ELEMENT PROVIDED WITH ORGANIC CONDUCTIVE AND INORGANIC HOLE TRANSPORT LAYERS BETWEEN AN ELECTRODE AND ORGANIC EMISSIVE LAYER

BACKGROUND OF THE INVENTION

1. Field of the Invention

The present invention relates to a technical field in respect of a light emitting device provided with an element having a structure interposing a thin film which emits light by a phenomenon called electroluminescence (hereinafter, referred to as "EL") between an anode and a cathode over a substrate.

2. Description of the Related Art

An EL element is an element which emits light by forming a thin film or a crystal containing an organic compound or an inorganic compound between a cathode and an anode and by flowing current between the cathode and anode. In recent years, an EL element in which a thin film (hereinafter, referred to as an organic thin film) chiefly containing an organic compound as a main constituent is located between a cathode and an anode, namely an organic EL element, has been actively developed.

The organic EL element is expected to be applied to various fields and is considered that the use thereof ranges from only a lightning appliance to a display used for a cellular phone and a personal computer, or the like. The organic EL element has been partially put to practical use as a display for automobile use, the display portion of a small electric appliance, and the like.

Figure 1A:
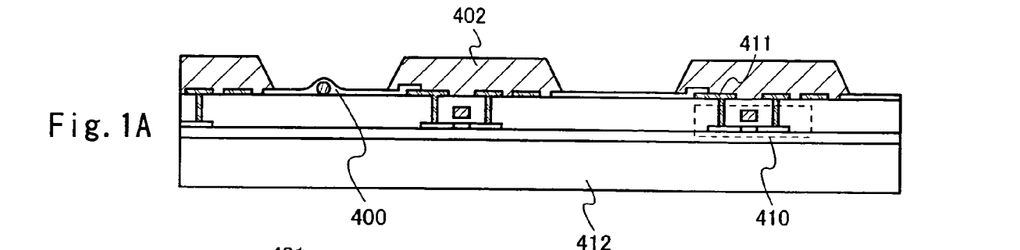
FIGS. 1A to 1E are explanatory views of a method for manufacturing a light emitting device of the present invention.

However, some problems on the organic EL element remain regardless of how the organic EL element is used. One of the problems is display failure due to a manufacturing process. Specifically, as shown in FIG. 1A, the organic EL element is a device in which a thin film containing an organic compound is located between two electrodes. In the organic EL element, electrons are injected from one electrode and holes are injected from another electrode to drive the organic EL element. Then, a hole and an electron are recombined in the thin film to form the excited state of a compound for light emission, namely a luminous body. Light emission can be obtained when the excited state returns to the ground state in a radiation step. That is, the organic EL element is a light emitting element which is driven only by the flow of current. Therefore, when current does not flow to a pixel or when current can not flow uniformly to a pixel by short circuit between two electrodes, light emission as an element is not obtained.

In particular, the short circuit between electrodes is a major concern. Several causes of the short circuit are considered. Crystallization of a material in a film and concentration of an electric field derived from the unevenness of the electrode surface, namely the surface roughness of the electrode surface can be given as main causes. The former cause can be solved by selecting a material which is difficult to be crystallized; however, the latter cause can not be solved only by contriving the material since the cause is attributable to a manufacturing process. For example, in the case where minute dust is generated during the process of manufacturing a substrate and then a first electrode is formed with the dust attached (FIG. 1B), a projection is formed in this electrode. When an EL element is formed over a pixel electrode having such a rough surface, an electric field concentrates in this projection and current required for light emission can not flow to other regions, and consequently, spots are generated in the light emission of the pixel. In addition, when the concentration of an electric field further proceeds, the element is destroyed and short-circuited between two electrodes. As a result, this pixel can not emit light in most of the region.

For example, in the case of applying the organic EL element as a high precision display, an EL element is manufactured in each pixel over the substrate of a simple matrix type (hereinafter, referred to as a passive matrix) or an active matrix type. Display can be performed by controlling current supplied to each pixel using an external circuit. At this time, when the pixel is short-circuited by the above problem due to the process, the pixel is recognized as a black spot (hereinafter, referred to as a blind spot) on the screen, and the display quality is diminished.

In the case of considering the application of the organic EL element for lightning, dust generated during the process can be removed with comparatively ease since the process for manufacturing a substrate is comparatively simple. However, in the case of considering the application for a display, minute dust generated during the process is hard to be completely removed since the process for manufacturing an active matrix type substrate is extremely complicated in particular. Especially when the panel is grown in size, subtle dust greatly influences on a yield; therefore, there is an urgent need to develop a method for forming an EL element which is not influenced by the surface roughness of a pixel electrode due to dust.

Figure 2A:
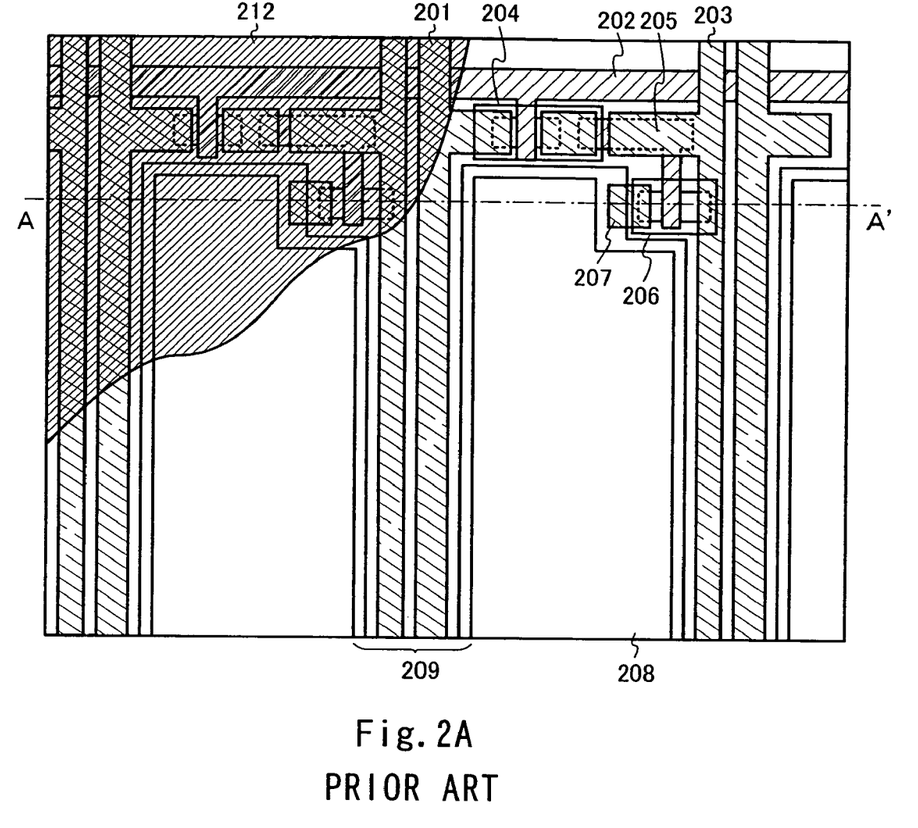
FIGS. 2A and 2B are explanatory views of a light emitting element of related art.

In a conventional pixel structure shown in FIG. 2A, reference numeral 201 denotes a data signal line; 202, a gate signal line; 203, a power source line; 204, a switching TFT; 205, a capacitor; 206, a driving TFT; 207, a drain electrode of the driving TFT; and 208, a pixel electrode connected to the drain electrode of the driving TFT. The pixel electrode 208 serves as an anode of a light emitting element.

Figure 2B:
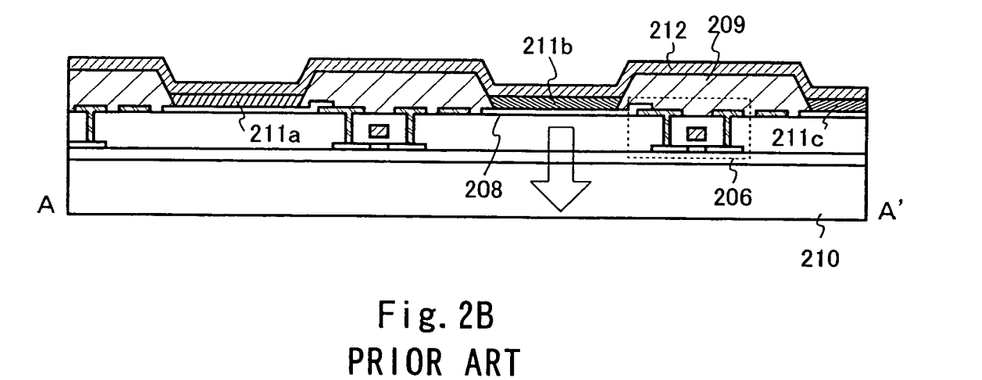

FIG. 2B shows a figure corresponding to a cross section in FIG. 2A taken along line A-A'. An insulator 209 patterned in a lattice shape is provided, so as to cover the edge portion of the pixel electrode 208 formed to be connected to the driving TFT 206 and at least the driving TFT and the switching TFT.

In FIGS. 2A and 2B, dust does not exist below the pixel electrode, and the pixel electrode 208 having high planarity is provided. Therefore, light emitting layers 211a to 211c formed over the pixel electrode 208 are not required to be thickly deposited on purpose. The thickness of the light emitting layer at this time is generally from 10 nm to 40 nm and approximately 100 nm at most. A cathode 212 is formed thereover.

Figure 3A:
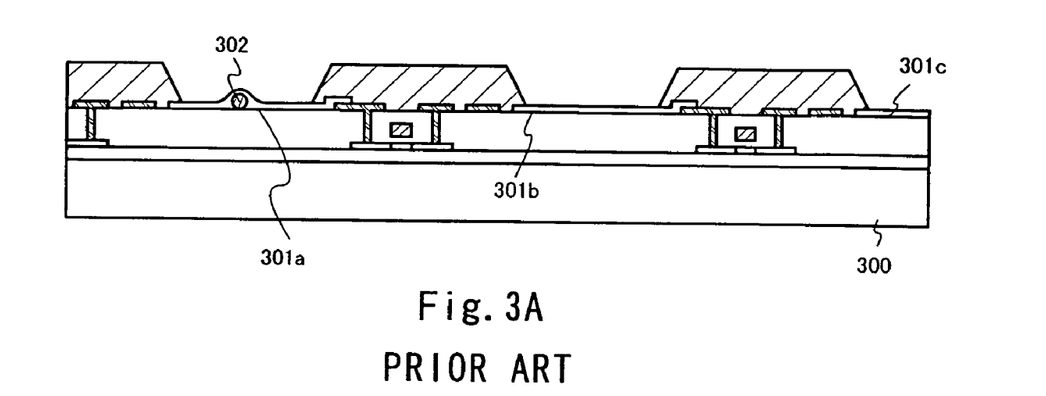
FIGS. 3A and 3B are explanatory views of a light emitting element of related art.

FIG. 3A shows a schematic view in the case where the planarity of a pixel electrode is lost since dust due to the process exists below the pixel electrode. In FIG. 3A, reference numeral 300 denotes a substrate, and reference numerals 301a to 301c denote pixel electrodes. The figure schematically shows that dust 302 due to the process exists below the pixel electrode 301a. The planarity of the pixel electrode 301a formed in this pixel portion is lost and a large projection shape is formed since the dust 302 is not completely removed.

Figure 3B:
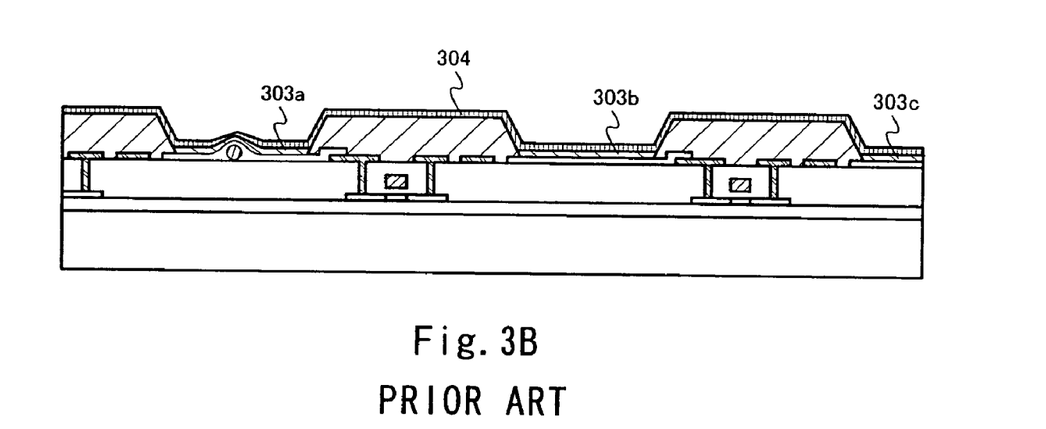

The film thickness of a general EL element is generally from 0.1 µm to 0.2 µm and approximately 0.5 µm at most. Therefore, in the case of manufacturing an EL element over an anode having a projection by a usual method, as shown in FIG. 3B, light emitting layers 303b and 303c having high planarity are formed over the pixel electrodes 301b and 301c; however, the planarity of the light emitting layer 303a formed over the pixel electrode 301a is lost and a large projection is formed. Further, a cathode 304 is formed over the light emitting layer formed as above; however, when current is flown in each pixel, light emission can not be virtually obtained in a region in which the pixel electrode 301a exists although light emission can be obtained in a light emitting region in which the pixel electrodes 301b and 301c exist. This is because the concentration of an electric field is easy to occur in a projection in the region the pixel electrode 301a exists, and the reliability of such a pixel is severely decreased. That is, this pixel region is recognized as a blind spot.

SUMMARY OF THE INVENTION

In view of the foregoing problems, it is an object of the present invention to provide a light emitting element with reduced inconvenience due to dust or the like and a manufacturing method thereof.

One feature of the invention is a light emitting element having a first layer provided so as to be in contact with a first electrode, and a second layer provided so as to be in contact with the first layer, between the first electrode and a second electrode. A light emitting layer exists between the second layer and the second electrode. The first electrode, the second electrode, the first layer, the second layer, and the light emitting layer are stacked so that the first layer is stacked firstly and the second layer is stacked secondly. Here, the first layer is a layer containing an organic compound. Especially, an organic compound having conductivity is preferable among organic compounds. Alternatively, the second layer is a layer containing an inorganic compound. In particular, an inorganic compound having hole transport property is preferable among inorganic compounds.

One feature of a manufacturing method of a light emitting element according to the invention includes a step of forming a first layer over a first electrode after forming the first electrode and further selectively forming a second layer in a portion which is over the first layer and which is stacked with the first electrode. The manufacturing method includes a step of etching the first layer using the second layer as a mask. Here, the first layer is a layer containing an organic compound. Especially, an organic compound having conductivity is preferable among organic compounds. Alternatively, the second layer is a layer containing an inorganic compound. In particular, an inorganic compound having hole transport property is preferable among inorganic compounds.

The surface roughness of a pixel electrode can be substantially relieved and an organic layer can be formed over a plain surface by thickly depositing a material having high conductivity. Accordingly, the partial concentration of an electric field can be restrained, and as a result, the generation of a pixel defect recognized as a blind spot can be prevented.

Further, a protective film having etching resistance and carrier transport property, preferably, hole transport property, is formed in a pixel portion, and then, etching is performed. According to this, only a conductive film formed over an insulator can be selectively removed, whereas the pixel portion is not etched. This protective film also serves as a carrier injecting or transporting layer, more specifically, a hole injecting or transporting layer to a light emitting layer; therefore, the protective film is not required to be removed. Hence, an EL element can be manufactured if the light emitting layer is formed over the protective film, and the generation of a blind spot and crosstalk can be restrained without complicating the process.

These and other objects, features and advantages of the present invention will become more apparent upon reading of the following detailed description along with the accompanied drawings.

DETAILED DESCRIPTION OF THE INVENTION

Hereinafter, one mode according to the present invention is described. However, it is easily understood by those who are skilled in the art that embodiments and details herein disclosed can be modified in various ways without departing from the purpose and the scope of the present invention. Therefore, it should be noted that the description of embodiment modes to be given below should not be interpreted as limiting the present invention.

Embodiment Mode 1

The case of forming an EL element over a substrate provided with a circuit for active matrix driving is described with reference to FIGS. 1A to 1E; however, the invention is not limited to the mode of a substrate, and a substrate provided with a circuit for passive matrix driving or a substrate having only a single pixel may be used.

First, an organic EL element is required to extract light; therefore, at least one of an anode and a cathode is required to be transparent. Hereinafter, a light emitting element in which light can be extracted from an anode side by forming a transparent anode over a substrate is explained. However, the invention is not limited to this structure. For example, the invention can be applied to a structure in which only a cathode is transparent or a structure in which both of an anode and a cathode are transparent to obtain light emission from the above and below the element.

Next, the light emitting element according to the invention is explained. In FIG. 1A, reference numeral 412 denotes a substrate having a circuit for active matrix driving including a transistor 410 and the like. The transistor 410 is electrically connected to a first electrode 400 of the light emitting element through a connection portion 411. A glass substrate, a quartz substrate, a plastic substrate, or the other transparent substrate can be used as the substrate 412.

Figure 1B:
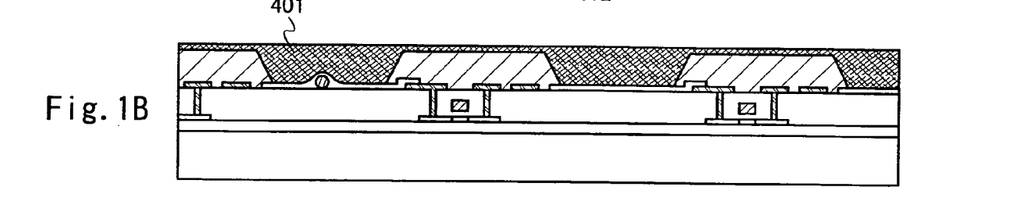

First, according to the invention, a thick conductive layer 401 is formed from a highly conductive material over the first electrode 400 exposed from an insulating layer 402 having an opening (FIG. 1B). The conductive layer 401 is preferably formed to have a film thickness of from 0.1 µm to 2 µm, and in particular, the conductive layer 401 is preferably formed to have a film thickness of from 0.2 µm to 1.5 µm.

Conductive materials capable of being used here are broadly classified into high molecular weight materials and low molecular weight materials. As high molecular weight materials having high conductivity, polyaniline derivatives doped with camphorsulfonic acid, toluenesulfonic acid, poly (styrenesulfonic acid), or the like, polythiophene derivatives, or the like are preferably used. In particular, poly(3,4-ethylenedioxythiophene) is preferable as the polythiophene derivatives since poly(3,4-ethylenedioxythiophene) has an advantage that drive voltage is hardly increased even if it is thickly deposited because of its extremely low oxidation potential and easy injection of a hole. These high molecular weight materials can not be deposited by a dry process such as evaporation; therefore, a wet process such as a spin coat method or a spray method is used.

A mixture of a donor compound and an acceptor compound is appropriately used as a low molecular weight conductive material. These two kinds of compounds are co-evaporated. Alternatively, a mixture solution thereof may be deposited by a wet process. A sulphur-containing compound such as tetrathiafulvalene, or an aromatic amine compound may be used as the donor compound. On the other hand, a compound having an electron-withdrawing substituent such as tetracyanoquinodimethane, in particular, quinone derivatives is appropriately used as the acceptor compound.

However, the conductive layer 401 is preferably formed using a high molecular weight material by a wet process. This is based on the following reasons. In the case of depositing a low molecular weight compound by a wet process, aggregation and crystallization are easily caused in many cases, and an amorphous film is difficult to be formed. Therefore, a low molecular weight compound may be deposited by a dry process such as a vacuum evaporation method. However, it is essentially and originally difficult to form a film having the film thickness of several micrometers by an evaporation method. On the other hand, as for the high molecular weight material, a uniform amorphous layer can be easily formed and the thickness thereof can be easily controlled by employing a wet process even though the high molecular weight material can not be deposited by a dry process. For these reasons, a high molecular weight material may be thickly formed by a wet process to accomplish the invention.

A conductive film which is transparent to visible light is preferably used for the first electrode 400 so that light emitted from a luminous body can be transmitted, and an oxide conductive film such as an ITO (compound of indium oxide and tin oxide) or a compound of indium oxide and zinc oxide is preferably used. These conductive metal oxide films are generally formed by sputtering; however, the conductive metal oxide films may be formed by applying a sol-gel method. In addition, metal having a high work function such as gold can be used as a material other than metal oxide. However, in this case, an extremely thin film is formed in consideration of optical transparency.

Figure 1C:
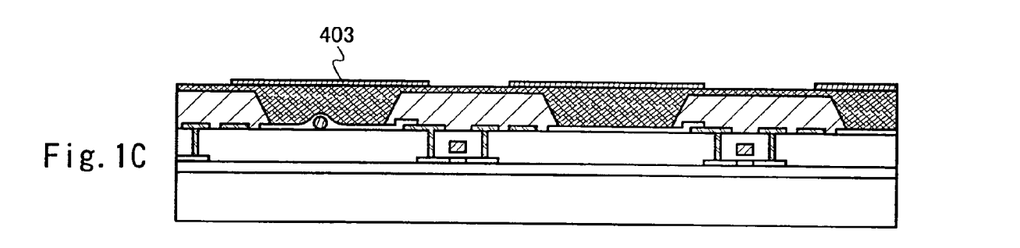

Next, the conductive layer 401 is formed in a pixel portion; however, in the invention, the conductive layer 401 can be formed over the insulating layer 402 patterned in a lattice shape so as to cover a driving TFT and a switching TFT in the case of forming a thick conductive film over the substrate. In particular, the conductive layer 401 may be deposited over the insulating layer 402 when formed by a wet process such as a spin coat method or a spray method. It is preferable that the conductive film with which the insulator is coated is removed to reduce crosstalk between the pixels, and the removal is carried out by etching. However, the portion of the conductive layer 401 stacked with the first electrode 400 is required to be prevented from being removed by etching. Accordingly, a protective layer 403 having etching resistance and containing an inorganic compound having carrier transport property, preferably, hole transport property, is provided over the pixel as a protective layer to etching (FIG. 1C). At this time, it is preferably that the protective layer 403 is selectively formed in a region stacked with the first electrode 400 using a shadow mask or the like by an evaporation method. The damage of the conductive layer 401 can be prevented by using an evaporation method. As the protective layer 403, transition metal oxide such as cobalt oxide, titanium oxide, niobium oxide, nickel oxide, neodymium oxide, vanadium oxide, molybdenum oxide, lanthanum oxide, ruthenium oxide, and rhenium oxide can be specifically given. Alternatively, various compounds containing metal can be used. For example, transition metal oxide of 4 to 7 groups, nitride, or halide may be used. These metal oxides, nitrides, halides, or the like are expected to be high in etching resistance compared with organic compounds. Therefore, the protective layer exists in the pixel portion after etching which will be described below. Further, this layer has carrier transport property, in particular, hole transport property. Therefore, carrier is injected from the conductive film to this protective layer, and carrier, especially hole, can be injected to a light emitting layer which is to be formed over this protective layer.

The above-described transition metal oxide, nitride, or halide can inject the hole by itself, and this is because electron transfer reaction is caused in the interface where these materials are in contact with the light emitting layer to form a so-called charge transfer complex. Hence, a charge transfer complex may be actively formed by adding an appropriate donor into these materials. An electron excess type organic compound can be given as the donor and tetrathiafulvalene, carbazole derivatives, and the like can be given as the electron excess type organic compound. In addition, an aromatic amine group which is classified into so-called hole transporting materials and hole injecting materials of organic EL elements are also preferable. Specifically, 4,4'-bis[N-(3-methylphenyl)-N-phenyl-amino]-biphenyl (TPD), 4,4'-bis[N-(1-naphthyl)-N-phenyl-amino]-biphenyl (NPB), and the like can be given.

Figure 1D:
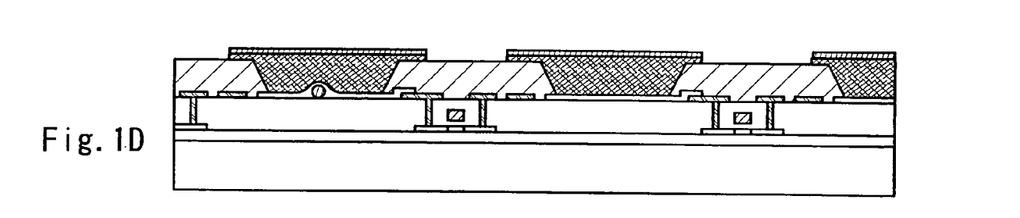

After thusly forming the protective layer 403, etching is performed using the protective layer 403 as a mask to remove the conductive layer 401 formed over the insulating layer 402. Etching is broadly classified into dry etching and wet etching; however, any of the methods may be used (FIG. 1D). Also, it preferable that an etched conductive layer 401 covers an edge of the insulating layer 402.

Figure 1E:
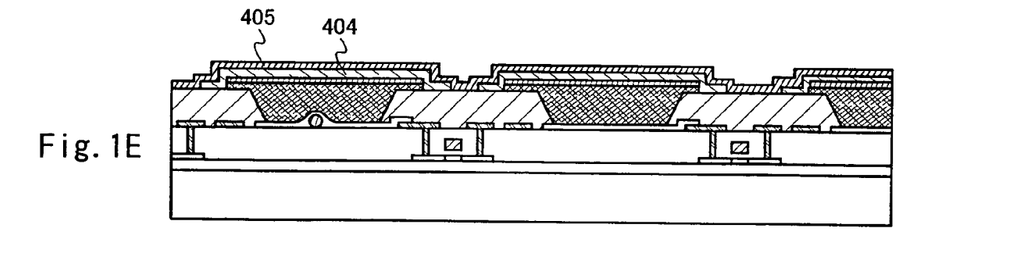

Accordingly, the conductive layer 401 and the protective layer 403 which is able to transport carriers are selectively formed in the pixel portion. Then, a light emitting layer 404 is formed over the protective layer 403 (FIG. 1E). This light emitting layer 404 is formed mainly using an organic compound; however, a thin film of a single composition may be used. For example, representative metal complexes such as tris(8-quinolinolato)aluminum (abbreviated as $Alq_3$), tris(4-methyl-8-quinolinolato)aluminum (abbreviated as $Almq_3$), bis(10-hydroxybenzo[h]quinolinato)beryllium (abbreviated as $BeBq_2$), bis(2-methyl-8-quinolinolato)-(4-hydroxy-biphenylyl)-aluminum (abbreviated as BAlq), bis[2-(2-hydroxyphenyl)-benzoxazolate]zinc (abbreviated as $Zn(BOX)_2$), bis[2-(2-hydroxyphenyl)-benzothiazolate]zinc (abbreviated as $Zn(BTZ)_2$), and the like can be given. Alternatively, a compound or the like containing hydrocarbon such as 9,10-diphenylanthracene or 4,4'-bis(2,2-diphenylethenyl)biphenyl is also preferable.

Further, the light emitting layer 404 may be a mixed layer of a plurality of materials. Luminous efficiency can be increased by adding a slight amount of a fluorescent pigment or a phosphorous pigment (hereinafter, referred to as a dopant) into the above described luminous body. As the fluorescent materials, coumarin derivatives, quinacridon derivatives, acridone derivatives, pyrene derivatives, perylene derivatives, anthracene derivatives, pyrone derivatives, and the like can be cited. Triplet light emitting materials can be given as the phosphorus pigment, and transition metal complexes of Ir, Ru, Ph, Pt or a rare earth metal or the like such as tris (2-phenylpyridine) iridium (hereinafter, referred to as Ir(ppy)$_3$) and 2,3,7,8,12,13,17,18-octaethyl-21H,23H-porphyrin-platinum (hereinafter, referred to as PtOEP) can be given as the triplet light emitting materials.

On the other hand, the light emitting layer 404 may be a film having a stacked structure. There is a case that injection balance of electrons and holes is difficult to control in the above described light emitting layer of a single composition or the mixed light emitting layer, and to solve the problem, a plurality of materials are stacked. Accordingly, the luminous efficiency can be improved. For example, a hole transporting layer for efficiently transporting injected holes into the light emitting layer, and an electron transporting layer for efficiently transporting injected electrons into the light emitting layer are preferably provided in addition to the above-described light emitting layer of a single composition or a mixed composition. Compounds containing aromatic amine (that is, a compound having a benzene ring-nitrogen bond) are given as examples as materials suitable for the hole transporting layer. As other widely-used materials, TPD, NPB which is a derivative thereof, star burst aromatic amine compounds such as 4,4',4"-tris[N,N-diphenyl-amino]-triphenyl amine, and 4,4',4"-tris[N-(3-methylphenyl)-N-phenyl-amino]-triphenyl amine can be given as examples. The representative metal complexes can be given as materials suitable for the electron transporting layer. As other materials, triazole derivatives such as 3-(4-tert-butylphenyl)-4-(4-ethylphenyl)-5-(4-biphenylyl)-1,2,4-triazole or phenanthroline derivatives such as bathophenanthroline and bathocuproin may be also used.

A deposition method of this light emitting layer 404 may be a so-called wet process such as a spin coat method, a dip coat method, a spray method as well as a vacuum vapor deposition method.

The small amount of the above-described dopant is added to the hole transporting layer, the electron transporting layer, or the like; however, the dopant is not limited to only one kind thereof, and two or more kinds of dopant may be simultaneously used. For example, white light emission can be obtained when two kinds of dopant are used, each of the emission color has complementary color relationship.

Further, an EL can be driven with lower voltage by forming a layer which promotes the electron injection over the light emitting layer 404 formed as above. Metals having a low work function and metal compounds thereof can be given as materials suitable for the electron injecting layer. Mg—Ag alloy, Al—Li alloy, Mg—Li alloy, Ca$_3$N$_2$, Mg$_3$N$_2$ and the like are given as examples thereof. Further, an organic semiconductor doped with a donor can be also an example as well as such metals. Compounds to serve as an acceptor are given as preferable examples of the organic semiconductors here, and electron transporting materials that are often used in light-emitting elements may be used. For example, representative metal complexes typified by Alq and the like, phenanthroline derivatives, triazine derivatives, oxazole derivatives, quinoline derivatives, quinoxaline derivatives, and the like can be given. Further, electron-accepting compounds such as tetracyano quinodimethane, tetracyanoethylene, and tetrachloroquinone are also preferable examples. Condensed aromatic hydrocarbon such as rubrene and perylene derivatives can be given as other examples. Conductive materials such as graphite can also be employed. Further, conjugated polymer (high molecular weight compound) such as polyphenylene vinylene, polyphenylene ethynylene or polypyridine can also be used. Metals having a low work function such as alkali metals and alkaline earth metals are preferable for the donor added into the organic semiconductor. Alternatively, electron excess type organic compounds such as tetrathiafulvalene may also be used. Note that it is essential that the acceptor property of such organic semiconductors is strong because the donor property of the electron excess type organic compounds is smaller than that of alkali metals or alkaline earth metals. As other examples than organic semiconductors, alkali metals, alkaline earth metals, rare earth metals, and compounds containing these metals are preferable. Specifically, calcium fluoride, lithium oxide, lithium chloride, lithium fluoride, magnesium fluoride, barium oxide, or the like can be given.

A second electrode 405 is formed over the light emitting layer 404 (FIG. 1E). A metal having a low work function and a metal compound thereof can be given as the second electrode 405. For example, Mg—Ag alloy, Al—Li alloy, Mg—Li alloy, and the like are given. In the case of using an electron injecting layer, Al which is a metal having a low work function may be used since electron injection barrier is lowered.

In the element manufactured as described above, electrons are injected from the second electrode 405 to the light emitting layer 404, and holes are injected from the first electrode 400 to the light emitting layer 404 by flowing current between pixel electrodes to emit light. The surface roughness of the anode caused by dust which is mixed during the process of manufacturing the substrate is eliminated by the thick conductive film; therefore, uniform light emission can be obtained from the whole pixel. Accordingly, the generation of blind spot can be restrained.

Embodiment Mode 2

A light emitting element of the present invention has less failure due to dust or the like; therefore, a light emitting device with no display failure or the like due to inconvenience of a light emitting element can be obtained using the light emitting element of the invention for a pixel or the like.

In this embodiment mode, the circuit configuration and driving method of a light emitting device including the light emitting element of the invention and having a display function are explained with reference to FIGS. 4 to 7.

Figure 4:
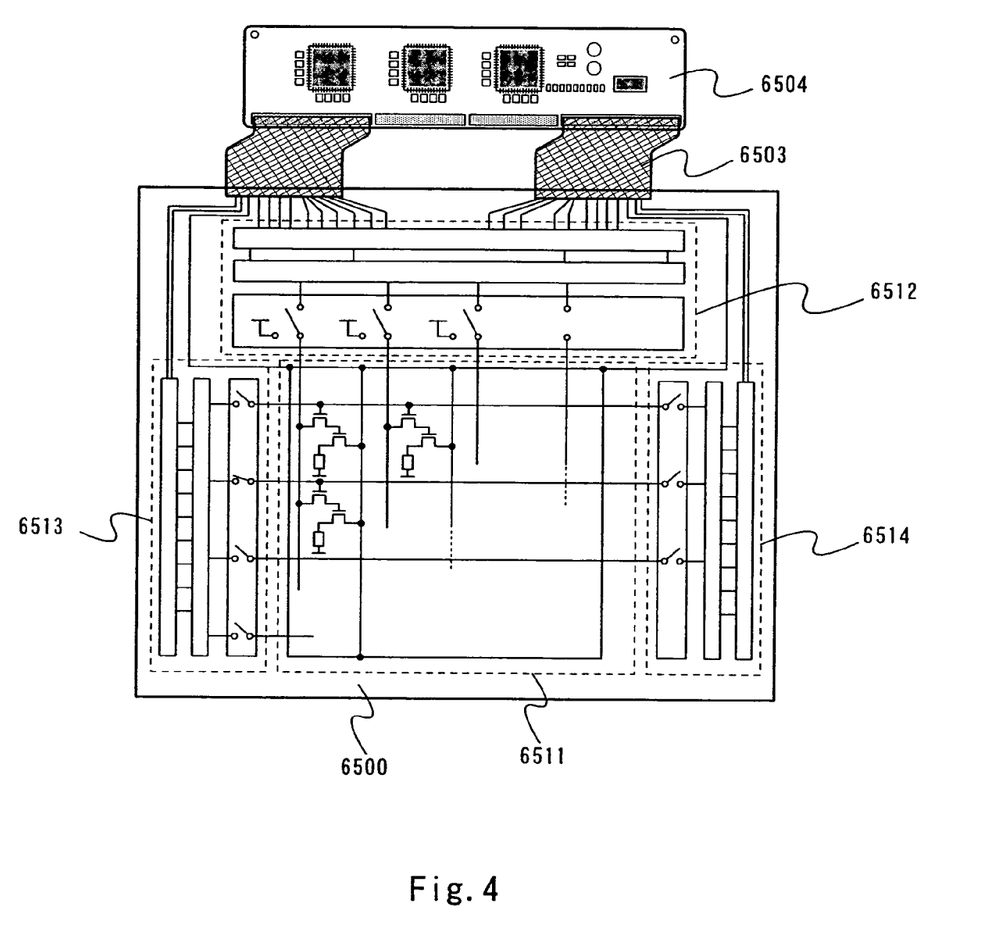
FIG. 4 is an explanatory diagram of a light emitting device to which the invention is applied.

FIG. 4 is a schematic top view of a light emitting device to which the invention is applied. In FIG. 4, a pixel portion 6511, a source signal line driver circuit 6512, a writing gate signal line driver circuit 6513, and an erasing gate signal line driver circuit 6514 are provided over a substrate 6500. The source signal line driver circuit 6512, the writing gate signal line driver circuit 6513, and the erasing gate signal line driver circuit 6514 each are connected to an FPC (Flexible Printed Circuit) 6503 which is an external input terminal through the group of wirings. The source signal line driver circuit 6512, the writing gate signal line driver circuit 6513, and the erasing gate signal line driver circuit 6514 receive a video signal, a clock signal, a start signal, a reset signal, and the like through the FPC 6503 respectively. A printed wiring board (PWB) 6504 is attached to the FPC 6503. A driver circuit portion is not required to be provided over the same substrate as the pixel portion 6511 as described above. For example, the driver circuit portion may be provided outside the substrate utilizing a TPC or the like which is formed by mounting an IC chip on an FPC provided with a wiring pattern.

In the pixel portion 6511, a plurality of source signal lines extended in a column direction is arranged in a row direction and current supply lines are arranged in the row direction. In the pixel portion 6511, a plurality of gate signal lines extended in the row direction are arranged in the column direction. Further, in the pixel portion 6511, a plurality of pixel circuits including the light emitting element is arranged.

Figure 5:
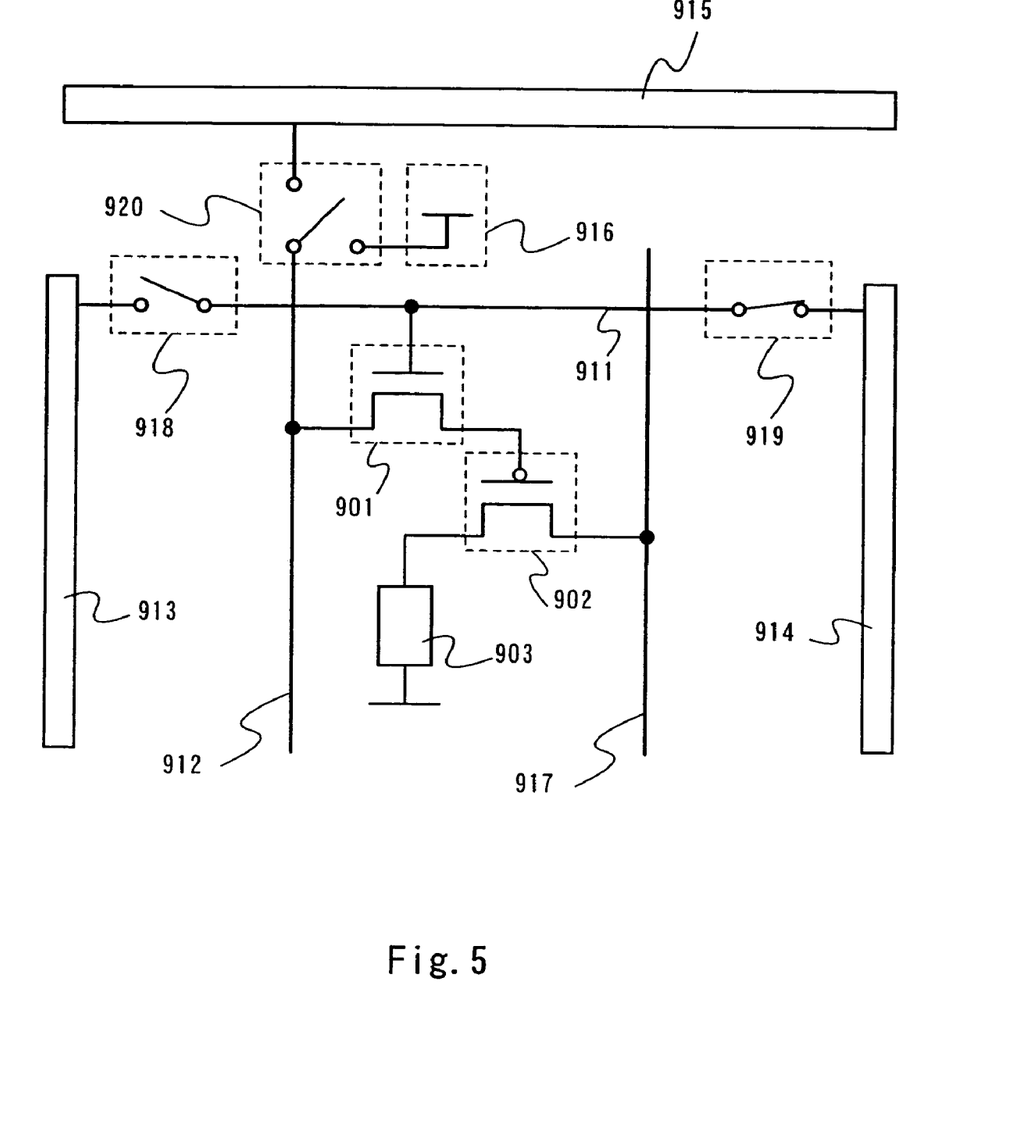
FIG. 5 is an explanatory diagram of a circuit included in a light emitting device to which the invention is applied.

FIG. 5 is a diagram showing a circuit for making one pixel operate. A first transistor 901, a second transistor 902, and a light emitting element 903 are included in the circuit shown in FIG. 5.

The first transistor 901 and the second transistor 902 each have three terminals including a gate electrode, a drain region, and a source region and have a channel region between the drain region and the source region. Here, since the source region and the drain region are determined according to the structure, operation condition, or the like of the transistor, it is difficult to confine which is the source region or the drain region. Therefore, in this embodiment mode, regions which serve as a source or a drain are respectively referred to as a first electrode or a second electrode.

A gate signal line 911 and a writing gate signal line driver circuit 913 are provided so as to be electrically connected or disconnected to each other through a switch 918. The gate signal line 911 and an erasing gate signal line driver circuit 914 are provided so as to be electrically connected or disconnected to each other through a switch 919. A source signal line 912 is provided so as to be electrically connected to one of a source signal line driver circuit 915 and a power source 916 through a switch 920. A gate of the first transistor 901 is electrically connected to the gate signal line 911. A first electrode of the first transistor 901 is electrically connected to the source signal line 912 and a second electrode thereof is electrically connected to a gate electrode of the second transistor 902. A first electrode of the second transistor 902 is electrically connected to a current supply line 917, and a second electrode thereof is electrically connected to one of electrodes included in the light emitting element 903. Further, the switch 918 may be included in the writing gate signal line driver circuit 913. The switch 919 may be also included in the erasing gate signal line driver circuit 914. In addition, the switch 920 may be included in the source signal line driver circuit 915.

Figure 6:
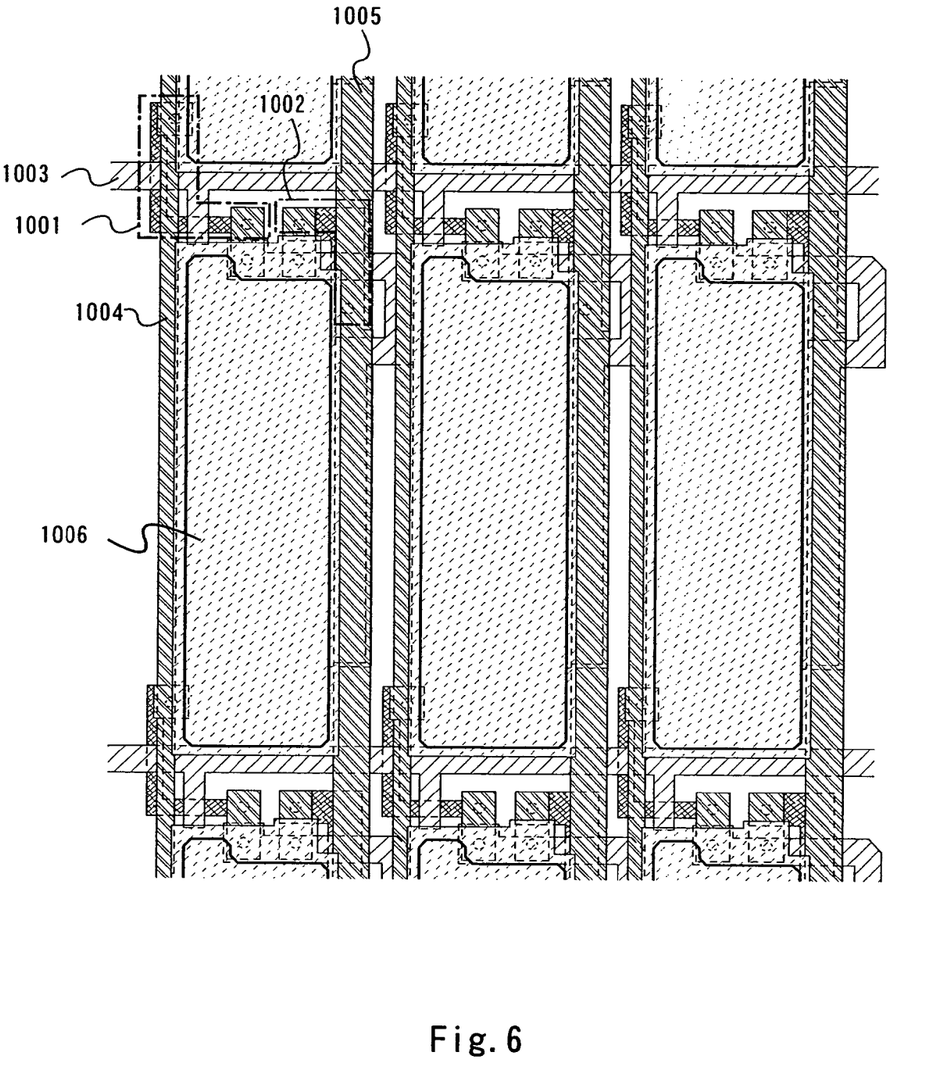
FIG. 6 is a top view of a light emitting device to which the invention is applied.

The arrangement of the transistor, the light emitting element, or the like in the pixel portion is not limited in particular; however, the transistor, the light emitting element, or the like can be arranged, for example, as shown in a top view of FIG. 6. In FIG. 6, a first electrode of a first transistor 1001 is connected to a source signal line 1004, and a second electrode thereof is connected to a gate electrode of a second transistor 1002. A first electrode of the second transistor 1002 is connected to a current supply line 1005, and a second electrode thereof is connected to an electrode 1006 of the light emitting element. A part of a gate signal line 1003 serves as a gate electrode of the first transistor 1001.

Figure 7:
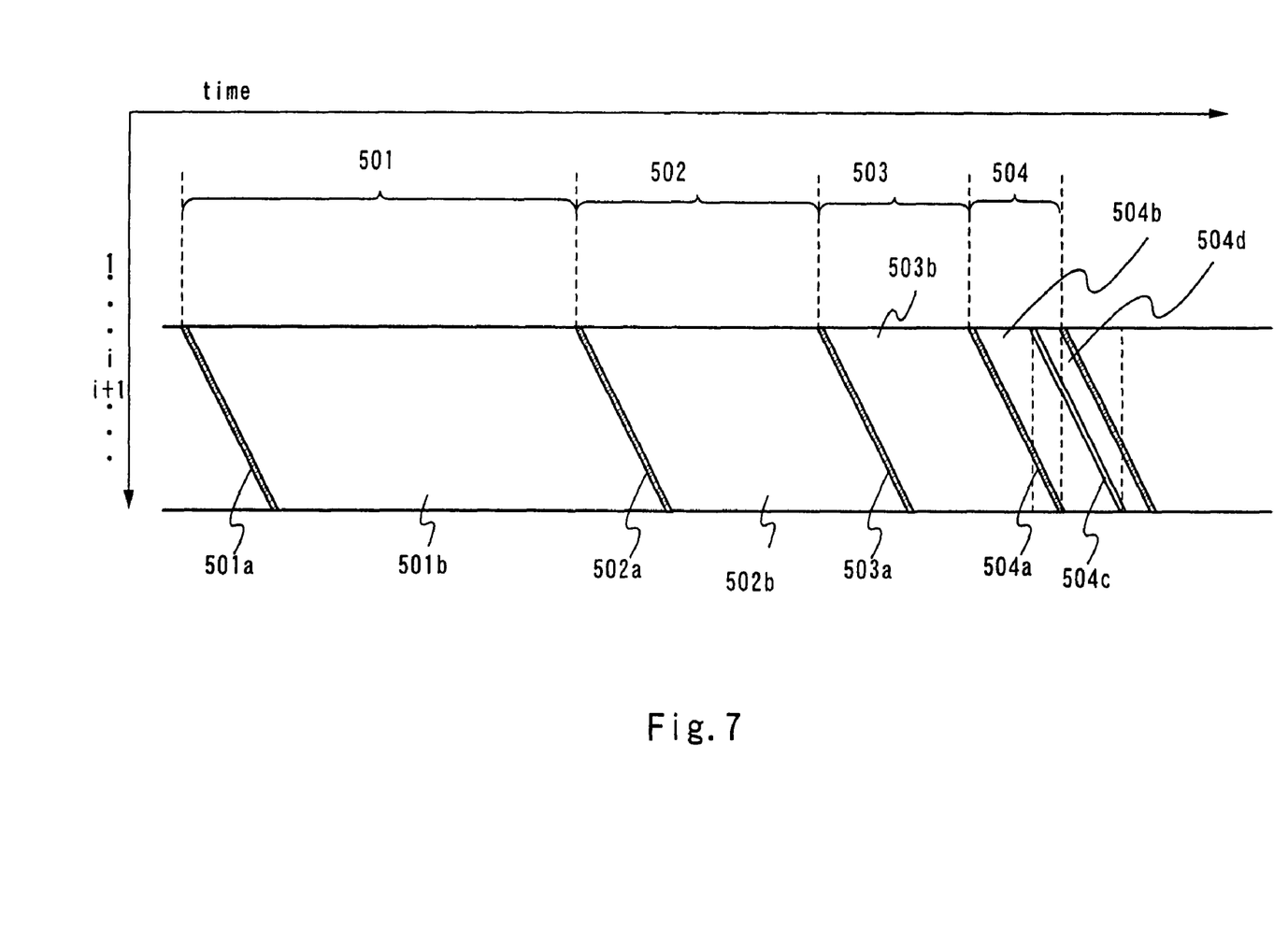
FIG. 7 is an explanatory view of frame operation of a light emitting device to which the invention is applied.

Next, a driving method is explained. FIG. 7 is an explanatory view of a frame operation with time. In FIG. 7, the abscissa-axis direction represents time passage, whereas the ordinate-axis direction represents scanning stages of a gate signal line.

When an image is displayed using a light emitting device according to the invention, a rewriting operation and a displaying operation of an image are repeatedly carried out in a display period. The number of rewriting operations is not especially limited; however, the rewriting operation is preferably performed at least approximately sixty times per one second so that a person who watches the image does not find flickering. Herein, the period of carrying out the rewriting operation and displaying operation of one image (one frame) is referred to as one frame period.

One frame period is time-divided into four sub-frame periods 501, 502, 503, and 504 including writing periods 501a, 502a, 503a, and 504a, and retention periods 501b, 502b, 503b, and 504b as shown in FIG. 7. A light emitting element that receives a signal for light emission emits light in the retention period. The length ratio of the retention period in each sub-frame period is the first sub-frame period 501: the second sub-frame period 502: the third sub-frame period 503: the fourth sub-frame period $504=2^3:2^2:2^1:2^0=8:4:2:1$. Accordingly, a 4-bit gray scale can be realized. The number of bits and gray scale levels is not limited thereto. For instance, an 8-bit gray scale can be offered by providing eight sub-frame periods.

An operation in one frame period is explained. Firstly, a writing operation is sequentially carried out from the first row to the last row in the sub-frame period 501. Therefore, the starting time of the writing period is different depending on the rows. The retention period 501b sequentially starts from the row where the writing period 501a is completed. In the retention period, a light emitting element that receives a signal for light emission emits light. The next sub-frame period 502 sequentially starts from the row where the retention period 501b is completed, and a writing operation is sequentially carried out from the first row to the last row as is the case with the sub-frame period 501. Operations as noted above are repeatedly carried out to finish the retention period 504b of the sub-frame period 504. When the operation in the sub-frame period 504 is completed, an operation in the next frame period is started. The sum of light emission time in each sub-frame period is a light emission time of each light emitting element in one frame period. By varying the light emission time for each light emitting element and combining the light emission time variously in one pixel, various colors can be displayed with different brightness and chromaticity.

Figure 9:
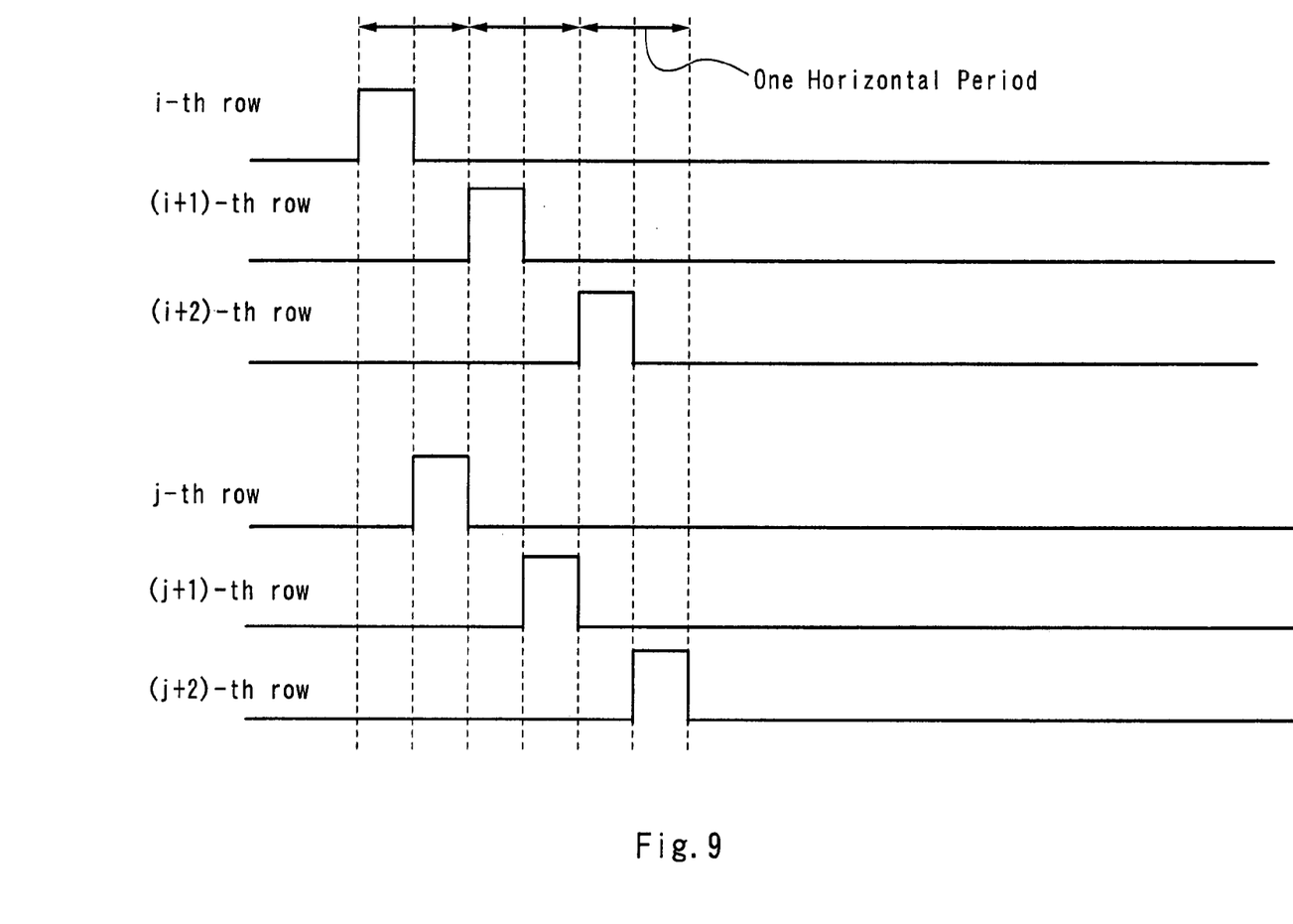
FIG. 9 is an explanatory view of a method for simultaneously selecting a plurality of gate signal lines in one horizontal period.

When a retention period in the row where writing has been already finished and the retention period has started is intended to be forcibly terminated before finishing the writing of the last row, an erasing period 504c is provided after the retention period 504b to control so that the light emission is forcibly stopped. The row where the light emission is forcibly stopped does not emit light during a fixed period (the period is referred to as a non-light-emission period 504d). Upon finishing the writing period of the last row, the next writing period (or a frame period) sequentially starts from the first row. Further, as shown in FIG. 9, one horizontal period is divided into two periods and writing is assigned to one period and erasing is assigned to another period so that writing is carried out in a pixel of a certain row and an erasing signal which makes a pixel non-light-emission state is inputted to the pixel of a certain row. Each gate signal line 911 is selected and a signal corresponding to that time is inputted to the source signal line 912 within the divided horizontal period. For example, an i-th row is selected in the anterior half of one horizontal period and a j-th row is selected in the last half thereof. Hence, it is possible to operate as if two rows are simultaneously selected in one horizontal period. In other words, a signal is written into a pixel within the writing periods 501a to 504a using the writing period of each horizontal period. At this time, a pixel is not selected in the erasing period of one horizontal period. At this time, a signal written in a pixel in the erasing period 504c is erased using the erasing period of the other horizontal period. The pixel is not selected in the writing period of one horizontal period. Accordingly, a display device having a pixel with high aperture ratio can be provided and yield can be enhanced.

In this embodiment mode, the sub-frame periods 501 to 504 are arranged in the order from the longest retention period; however, the invention is not limited thereto. For instance, the sub-frame periods 501 to 504 may be arranged in the order from the shortest retention period or may be arranged at random combining short sub-frame periods and long sub-frame periods. The sub-frame period may be further divided into a plurality of frame periods. That is, scanning of the gate signal line may be carried out a plurality of times during the period of giving the same video signal.

The operation of the circuit shown in FIG. 6 in a writing period and an erasing period is explained.

First, an operation in the writing period is explained. In the writing period, the gate signal line 911 at the i-th row (i is a natural number) is electrically connected to the writing gate signal line driver circuit 913 through the switch 918. The gate signal line 911 is not connected to the erasing gate signal line driver circuit 914. The source signal line 912 is electrically connected to the source signal line driver circuit 915 through the switch 920. Here, a signal is inputted to the gate of the first transistor 901 connected to the gate signal line 911 at the i-th row to turn on the first transistor 901. Then, at this moment, video signals are simultaneously inputted to the source signal lines in the first to last column. The video signals inputted from the source signal line 912 at each column are independent from each other. The video signal inputted from the source signal line 912 is inputted to the gate electrode of the second transistor 902 through the first transistor 901 connected to each source signal line. At this moment, the signal inputted to the gate electrode of the second transistor 902 determines on or off state of the second transistor 902. When the second transistor 902 is turned on, voltage is applied to the light emitting element 903 to flow current in the light emitting element 903. In other words, whether the light-emitting element 903 emits light or not is determined according to the signal inputted to the gate electrode of the second transistor 902. For example, when the second transistor 902 is a P-channel type, the light emitting element 903 emits light by inputting a Low Level signal to the gate electrode of the second transistor 902. On the other hand, when the second transistor 902 is an N-channel type, the light emitting element 903 emits light by inputting a High Level signal to the gate electrode of the second transistor 902.

Next, an operation in the erasing period is explained. In the erasing period, the gate signal line 911 at the j-th row (j is a natural number) is electrically connected to the erasing gate signal line driver circuit 914 through the switch 919. The gate signal line 911 is not connected to the writing gate signal line driver circuit 913. The source signal line 912 is electrically connected to the power source 916 through the switch 920. Here, a signal is inputted to the gate of the first transistor 901 connected to the gate signal line 911 at the j-th row to turn on the first transistor 901. Then, at this moment, erasing signals are simultaneously inputted to the source signal lines at the first column to the last column. The erasing signal inputted from the source signal line 912 is inputted to the gate electrode of the second transistor 902 through the first transistor 901 connected to each source signal line. At this time, the second transistor 902 is turned off by the erasing signal inputted to the gate electrode of the second transistor 902 to block current supply from the current supply line 917 to the light emitting element 903. Thus, the light emitting element 903 is forcibly made to be in a non-light-emission state. For example, when the second transistor 902 is a P-channel type, the light emitting element 903 does not emit light by inputting a High Level signal to the gate electrode of the second transistor 902. On the other hand, when the second transistor 902 is an N-channel type, the light emitting element 903 does not emit light by inputting a Low Level signal to the gate electrode of the second transistor 902.

In the erasing period, a signal for erasing is inputted to the j-th row by the operation as described above. However, there is a case that the j-th row is in an erasing period and the other row (referred to as an i-th row in this instance) is in a writing period. In this instance, it is required that a signal for erasing is inputted to the j-th row and a signal for writing is inputted to the i-th row by utilizing a source signal line of the same column. Therefore, operation explained as follows is preferably carried out.

Immediately after the light emitting element 903 at the (j−1)-th row is made to be a non-light-emission state by the operation in the erasing period, the gate signal line 911 is disconnected to the erasing gate signal line driver circuit 914, and the source signal line 912 is connected to the source signal line driver circuit 915 by shifting the switch 920. As well as connecting the source signal line 912 to the source signal line driver circuit 915, the gate signal line 911 is connected to the writing gate signal line driver circuit 913 by shifting the switch 918. A signal is selectively inputted to the gate signal line 911 at the i-th row from the writing gate signal line driver circuit 913 to turn on the first transistor 901, and video signals for writing are inputted to the source signal lines 912 in the first to the last column from the source signal line driver circuit 915. The light emitting element 903 at the i-th row emits light or does not emit light depending on the video signals.

Upon finishing the writing period of the i-th row as noted above, an erasing period of the j-th row starts. Hence, the gate signal line and the writing gate signal line driver circuit 913 are disconnected to each other by shifting the switch 918, and the source signal line and the power source 916 are connected to each other by shifting the switch 920. Further, the gate signal line 911 and the writing gate signal line driver circuit 913 are disconnected to each other, and the gate signal line 911 is connected to the erasing gate signal line driver circuit 914 by shifting the switch 919. When a signal is selectively inputted to the gate signal line 911 at the j-th row from the erasing gate signal line driver circuit 914 to turn on the first transistor 901, an erasing signal is inputted from the power source 916. Thus, the light emitting element 903 is forcibly made to be in a non-light-emission state. Upon finishing the erasing period of the j-th row, a writing period of the (i+1)-th row starts. Hereinafter, similarly, an erasing period and a writing period may be carried out repeatedly to complete an erasing period of the last row.

In this embodiment mode, a mode in which the writing period of the i-th row is provided between the erasing period of the (j−1)-th row and the erasing period of the j-th row is explained. However, without being limited to this, the writing period of the i-th row may be provided between the erasing period of the j-th row and the erasing period of the (j+1)-th row.

Further, in this embodiment mode, when the non-light-emission period 504d is provided as in the sub-frame period 504, the operation of disconnecting the erasing gate signal line driver circuit 914 to a certain gate signal line and connecting the writing gate signal line driver circuit 913 to the other gate signal line is repeatedly carried out. Such an operation may be carried out in a frame period that is not provided with a non-light-emission period.

Embodiment Mode 3

A light emitting device including a light emitting element according to the present invention can display a favorable image; therefore, an electronic device which can provide an excellent image can be obtained by applying the light emitting device according to the invention to the display portion of an electronic device.

Figure 8A:
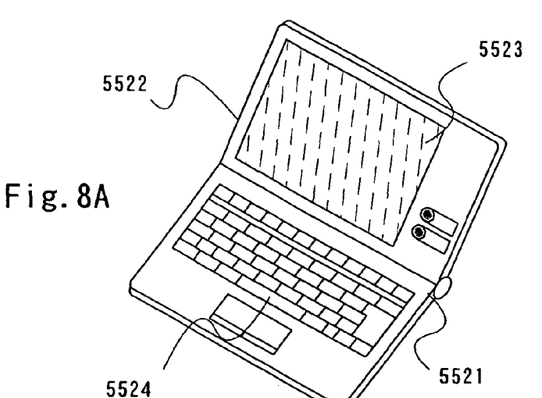
FIGS. 8A to 8C are views of an electronic device to which the invention is applied.
Figure 8B:
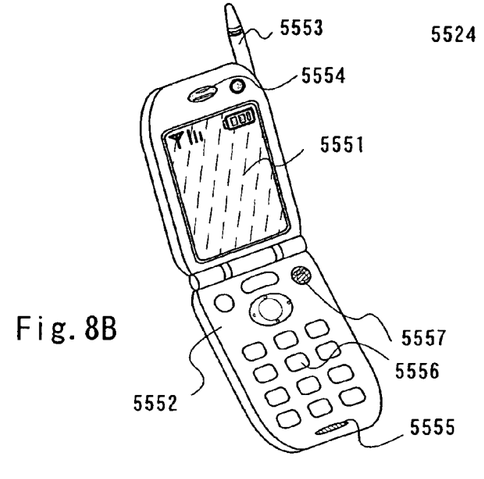
Figure 8C:
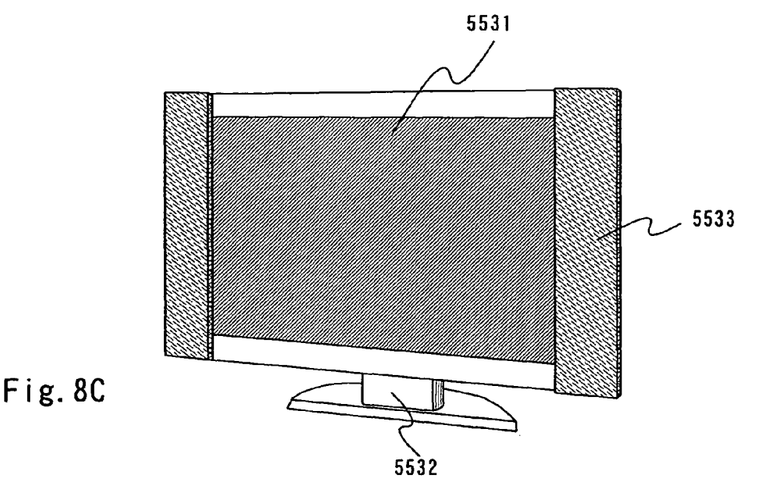

One example of the electronic device mounted with the light emitting device to which the invention is applied is shown in FIGS. 8A to 8C.

FIG. 8A is a personal computer manufactured by applying the invention, which includes a main body 5521, a casing 5522, a display portion 5523, a keyboard 5524, and the like. The personal computer can be completed by incorporating the light emitting device having the light emitting element according to the invention as the display portion.

FIG. 8B is a telephone manufactured by applying the invention, which includes a main body 5552, a display portion 5551, an audio output portion 5554, an audio input portion 5555, operation switches 5556 and 5557, an antenna 5553, and the like. The telephone can be completed by incorporating the light emitting device having the light emitting element according to the invention as the display portion.

FIG. 8C is a television set manufactured by applying the invention, which includes a display portion 5531, a casing 5532, a speaker 5533, and the like. The TV set can be completed by incorporating the light emitting device having the light emitting element according to the invention as the display portion.

As above, the light emitting devices according to the invention are much suitable for being used as the display portions of various electronic devices.

In this embodiment mode, the personal computer, the telephone set, and the television set are described; however, in addition to this, a navigation system, a lightning appliance, or the like may be mounted with the light emitting device having a light emitting element according to the invention.

This application is based on Japanese Patent Application serial No. 2004-244803 field in Japan Patent Office on Aug. 25th, 2004, the contents of which are hereby incorporated by reference.

What is claimed is:

1. A light emitting element comprising:
a first electrode;
a first layer, which comprises an organic compound and has conductivity, formed over the first electrode;
a second layer, which comprises an inorganic compound and has a hole transport property, formed over the first layer;
a light emitting layer formed over the second layer; and
a second electrode formed over the light emitting layer,
wherein the first layer has a thickness larger than that those of the first electrode, the second layer, the light-emitting layer and the second electrode.

2. A light emitting element according to claim 1, wherein the organic compound is a polythiophene derivative containing at least one compound selected from the group consisting of camphorsulfonic acid, toluenesulfonic acid, and poly(styrenesulfonic acid).

3. A light emitting element according to claim 1, wherein the inorganic compound is at least one compound selected from the group consisting of cobalt oxide, titanium oxide, niobium oxide, nickel oxide, neodymium oxide, vanadium oxide, molybdenum oxide, lanthanum oxide, ruthenium oxide, and rhenium oxide.

4. An electronic device having the light emitting element according to claim 1, wherein the electronic device is selected from the group consisting of a personal computer, a telephone, and a television.

5. A light emitting element according to claim 1, wherein the first layer has a thickness of from 0.1 μm to 2 μm.

6. A light emitting element according to claim 1, wherein the second layer is in contact with the light emitting layer.

7. A light emitting device comprising:
a thin film transistor formed over a substrate;
a first electrode formed over the thin film transistor;
a first layer, which comprises an organic compound and has conductivity, formed over the first electrode;
a second layer, which comprises an inorganic compound and has a hole transport property, formed over the first layer;
a light emitting layer formed over the second layer; and
a second electrode formed over the light emitting layer,
wherein the first layer has a thickness larger than that those of the first electrode, the second layer, the light-emitting layer and the second electrode.

8. A light emitting device according to claim 7, wherein the organic compound is a polythiophene derivative containing at least one compound selected from the group consisting of camphorsulfonic acid, toluenesulfonic acid, and poly(styrenesulfonic acid).

9. A light emitting device according to claim 7, wherein the inorganic compound is at least one compound selected from the group consisting of cobalt oxide, titanium oxide, niobium oxide, nickel oxide, neodymium oxide, vanadium oxide, molybdenum oxide, lanthanum oxide, ruthenium oxide, and rhenium oxide.

10. An electronic device having the light emitting device according to claim 7, wherein the electronic device is selected from the group consisting of a personal computer, a telephone, and a television.

11. A light emitting element according to claim 7, wherein the first layer has a thickness of from 0.1 μm to 2 μm.

12. A light emitting element according to claim 7, wherein the second layer is in contact with the light emitting layer.

13. A light emitting element comprising:
a first electrode;
an insulating layer formed over the first electrode;
a first layer, which comprises an organic compound and has conductivity, formed over the first electrode so as to cover an edge of the insulating layer;
a second layer, which comprises an inorganic compound and has a hole transport property, formed over the first layer;
a light emitting layer formed over the second layer; and
a second electrode formed over the light emitting layer,
wherein the thickness of a portion of the first layer is larger than a thickness of the insulating layer.

14. A light emitting element according to claim 13, wherein the organic compound is a polythiophene derivative containing at least one compound selected from the group consisting of camphorsulfonic acid, toluenesulfonic acid, and poly(styrenesulfonic acid).

15. A light emitting element according to claim 13, wherein the inorganic compound is at least one compound selected from the group consisting of cobalt oxide, titanium oxide, niobium oxide, nickel oxide, neodymium oxide, vanadium oxide, molybdenum oxide, lanthanum oxide, ruthenium oxide, and rhenium oxide.

16. An electronic device having the light emitting element according to claim 13, wherein the electronic device is selected from the group consisting of a personal computer, a telephone, and a television.

17. A light emitting element according to claim 13, wherein the second layer is in contact with the light emitting layer.

18. A light emitting element according to claim 13, wherein an entire top surface of the first layer is above a top surface of the insulating layer.

19. A light emitting element according to claim 13, wherein an end face of the first layer is coincident with an end face of the second layer over the insulating layer.

20. A light emitting element according to claim 13, wherein a portion of the second electrode is in contact with the insulating layer.

21. A light emitting element according to claim 13, wherein the first layer has a thickness of from 0.1 μm to 2 μm.

22. A light emitting device comprising:
a thin film transistor formed over a substrate;
a first electrode formed over the thin film transistor;
an insulating layer formed over the first electrode;
a first layer, which comprises an organic compound and has conductivity, formed over the first electrode so as to cover an edge of the insulating layer;
a second layer, which comprises an inorganic compound and has a hole transport property, formed over the first layer;
a light emitting layer fowled over the second layer; and
a second electrode formed over the light emitting layer,
wherein the thickness of a portion of the first layer is larger than a thickness of the insulating layer.

23. A light emitting device according to claim 22, wherein the organic compound is a polythiophene derivative containing at least one compound selected from the group consisting of camphorsulfonic acid, toluenesulfonic acid, and poly(styrenesulfonic acid).

24. A light emitting device according to claim 22, wherein the inorganic compound is at least one compound selected from the group consisting of cobalt oxide, titanium oxide, niobium oxide, nickel oxide, neodymium oxide, vanadium oxide, molybdenum oxide, lanthanum oxide, ruthenium oxide, and rhenium oxide.

25. An electronic device having the light emitting device according to claim 22, wherein the electronic device is selected from the group consisting of a personal computer, a telephone, and a television.

26. A light emitting device according to claim 22, wherein the second layer is in contact with the light emitting layer.

27. A light emitting device according to claim 22, wherein an entire top surface of the first layer is above a top surface of the insulating layer.

28. A light emitting device according to claim 22, wherein an end face of the first layer is coincident with an end face of the second layer over the insulating layer.

29. A light emitting device according to claim 22, wherein a portion of the second electrode is in contact with the insulating layer.

30. A light emitting element according to claim 22, wherein the first layer has a thickness of from 0.1 μm to 2 μm.

* * * * *

UNITED STATES PATENT AND TRADEMARK OFFICE
CERTIFICATE OF CORRECTION

| | | |
|---|---|---|
| PATENT NO. | : 7,755,278 B2 | |
| APPLICATION NO. | : 11/202891 | |
| DATED | : July 13, 2010 | |
| INVENTOR(S) | : Ryoji Nomura, Tsunenori Suzuki and Satoshi Seo | |

It is certified that error appears in the above-identified patent and that said Letters Patent is hereby corrected as shown below:

In The Claims:

Column 15, Claim 22, Line 19, Change "fowled" to -- formed --.

Signed and Sealed this
Fifteenth Day of March, 2011

David J. Kappos
*Director of the United States Patent and Trademark Office*